US012627295B2

(12) United States Patent　　　(10) Patent No.: US 12,627,295 B2
Ishihara et al.　　　　　　　　　　(45) Date of Patent: May 12, 2026

(54) PERSISTENT CURRENT SWITCH

(71) Applicant: Technische Universiteit Delft, Delft (NL)

(72) Inventors: Ryoichi Ishihara, Rijswijk (NL); Salahuddin Nur, Delft (NL); Jaime Oscar Tenorio Pearl, Veldhoven (NL)

(73) Assignee: TECHNISCHE UNIVERSITEIT DELFT, Delft (NL)

( * ) Notice: Subject to any disclaimer, the term of this patent is extended or adjusted under 35 U.S.C. 154(b) by 0 days.

(21) Appl. No.: 18/725,440

(22) PCT Filed: Jan. 2, 2023

(86) PCT No.: PCT/NL2023/050001
§ 371 (c)(1),
(2) Date: Jun. 28, 2024

(87) PCT Pub. No.: WO2023/128767
PCT Pub. Date: Jul. 6, 2023

(65) Prior Publication Data
US 2025/0088188 A1　　Mar. 13, 2025

(30) Foreign Application Priority Data

Jan. 3, 2022　(NL) ..................................... 2030396

(51) Int. Cl.
*H03K 17/92*　　(2006.01)
(52) U.S. Cl.
CPC ................................... *H03K 17/92* (2013.01)

(58) Field of Classification Search
CPC ...................................................... H03K 17/92
USPC ........................................................ 327/527
See application file for complete search history.

(56) References Cited

U.S. PATENT DOCUMENTS 8,138,880　B2　　3/2012　Keefe et al.
2014/0183875　A1　　7/2014　Sines

FOREIGN PATENT DOCUMENTS

JP　　H08250775　A1　　9/1996
WO　　2015092566　A1　　6/2015

OTHER PUBLICATIONS

Park et al. "Trapped Vortices in a Superconducting Microbridge", IEEE Transactions on Magnetics, Mar. 1, 1991, pp. 3021-3024, vol. 27, No. 5. (Year: 1991).*
Atabaki et al. "Integrating Photonics with Silicon Nanoelectronics for the Next Generation of Systems on a Chip", Nature, 2018, pp. 349-354, No. 556.

(Continued)

*Primary Examiner* — Tomi Skibinski
(74) *Attorney, Agent, or Firm* — Steven M. Koehler; Westman, Champlin & Koehler, P.A.

(57)　　　　　ABSTRACT

A persistent current switch is disclosed for controlling, e.g. initiating, a persistent current in a superconductor loop. The persistent current switch comprises a piece of superconductor material that is part of the superconductor loop. Further, the persistent current switch comprises an illumination system that is configured to direct light onto the piece of superconductor material for influencing an electrical resistance of the piece of superconductor material. The illumination system is configured such that the light impinging on the piece of superconductor material substantially does not heat the piece of superconductor material.

18 Claims, 5 Drawing Sheets

(56)  References Cited

OTHER PUBLICATIONS

Bachandani et al. "Thin Film Persistent Current Switch", IEEE Trans. Appl. Supercond., 2005, pp. 3821-3826, vol. 15, No. 3.

Jelezko, F. and Wrachtrup, J. "Single Defect Centres in Diamond: A Review", Phys. Stat. Sol. (a), 2006, p. 3207, vol. 203, No. 13.

Leuthold et al. "Characterization of a Simple Thin Film Superconducting Switch", IEEE Trans. Appl. Supercond., 1994, pp. 181-183, vol. 4, No. 3.

Li et al. "Persistent Current Switch for HTS Superconducting Magnets: Design, Control Strategy and Test Results", IEEE Transactions on Applied Superconductivity, Mar. 2019, vol. 29, No. 2.

Park et al. "Trapped Vortices in a Superconducting Microbridge", IEEE Transactions on Magnetics, Mar. 1, 1991, pp. 3021-3024, vol. 27, No. 5.

Seok et al. "Large-Scale Broadband Digital Silicon Photonic Switches with Vertical Adiabatic Couplers" Optica, 2016, pp. 64-70, vol. 3.

International Search Report and Written Opinion in corresponding International Application No. PCT/NL2023/050001 dated Apr. 11, 2023.

\* cited by examiner

2

2

PERSISTENT CURRENT SWITCH

CROSS-REFERENCE TO RELATED APPLICATIONS

The present application is a Section 371 National Stage Application of International Application No. PCT/NL2023/050001, filed Jan. 2, 2023, and further claims priority to Dutch patent application no. 2030396, filed Jan. 3, 2022.

FIELD OF THE INVENTION

This disclosure relates to a persistent current switch for controlling a persistent current in a superconductor loop. Further, this disclosure relates to a chip and a quantum computing system comprising such switch. This disclosure also relates to a method for initiating a persistent current in a superconductor loop.

BACKGROUND

Quantum computing devices need high precision magnetic bias signals to accurately set the operating point of the qubits. Since very low heat dissipation is required, low power operation of control electronics is necessary. The current fluctuation must also be very low to avoid decohering the qubit. Because the qubit is operated at temperatures in a few Kelvin regime, using conventional wires and driving electronics for generating the required control magnetic field will heat the refrigerator considerably and inject undesirable noise into the device. The cryostat has a limited cooling power and hence it is important to keep the power dissipation low in order to keep the temperature low and/or reduce thermal noise.

One way to solve these problems is to generate a magnetic field with a superconducting loop controlled by a persistent current switch (PCS). A persistent current switch can be regarded as a variable resistance. Typically, a PCS is connected in parallel with an external DC power supply and the superconducting loop, usually forming a coil. During what is called the charging or energizing process, the PCS preferably has a relatively high resistance so that the external power supply can energize the superconducting loop. After the loop has been sufficiently charged, the PCS switches to a zero-resistant state to short-circuit the loop. As a result of this short circuit, a closed superconductive loop is formed in which an electrical current is flowing. Due to the superconductive state of the loop, this electrical current will continue to flow forever, in principle, without requiring a continuous driving current.

A disadvantage of thermally controlled persistent current switches is that they require the generation of heat in order to control the switch. In particular, a part of the superconductor loop is heated so that that part is not superconductive. However, heat is actually undesired as quantum chips are operated at very low temperature. Further, it takes some time for the heated part of the superconductor loop to cool down again and adopt a superconductive state. Sometimes this "recover time" can take several seconds even. Such a long recovery time is undesired because the current that is present in the superconductor loop will be consumed by the resistance of the switch during the recovery, leading to lower persistent currents and/or higher power losses.

In light of the above, there is a need in the art for a persistent current switch that enables to efficiently initiate a persistent current in a superconductive loop.

SUMMARY

To that end, a persistent current switch is disclosed for controlling, e.g. initiating, a persistent current in a superconductor loop. The persistent current switch comprises a piece of superconductor material that is part of the superconductor loop. Further, the persistent current switch comprises an illumination system that is configured to direct light onto the piece of superconductor material for influencing an electrical resistance of the piece of superconductor material. The illumination system is configured such that the light impinging on the piece of superconductor material substantially does not heat the piece of superconductor material.

In particular, the illumination system may be configured as such in that a light source of the illumination system is configured to generate light having a certain radiant flux.

The disclosed persistent current switch enables to control a persistent current in a highly efficient manner. The switch is based on a variable resistance of the piece of superconductor, the value of which depends on whether the piece of superconductor receives light or not from the illumination system. The disclosed persistent current switch may be regarded as a so-called photonic switch. In principle, the electrical resistance of the piece of superconductor increases upon the light interacting with the piece of superconductor. It is believed that suitable light breaks so-called Cooper pairs that are present in the piece of superconductor material which prevents the piece of superconductor material to become superconductive. Breaking the Cooper pairs namely lowers the critical current for superconductivity for the piece of superconductor material. Advantageously, no heat generation is required for controlling the disclosed switch rendering it suitable for cryostat environments. Note that quantum chips, i.e., chips that comprise an array of one or more qubits and preferably also circuitry for controlling those, typically operate in such cryostat environments. Hence, the switch does not need to cool down during some time period for it to become superconductive again. The disclosed persistent current switch in principle has no recovery time referred to above. Advantageously, the switch is not controlled by any AC magnetic field which would represent noise for other electrical circuits near the switch, such as noise for potential qubits that are generated near the switch. As described in the background section, quantum computing devices need accurate magnetic bias signals which are preferably generated by persistent currents in a superconductor loop.

The disclosed persistent current switch is suitable for integration on a chip, it is for example compatible with photonic integrated chip technology, meaning that many of them can be integrated on a single chip in order to control many qubits via the magnetic fields generated by the superconductor loops controlled respectively by the many persistent current switches. Herewith, the disclosed persistent current switch provides a scalable solution for quantum chip control.

In particular, the described persistent current switch may be used to realize an on-chip superconducting coil magnetic field generator (MFG) for a scalable quantum integrated circuit/system. The magnetic field generator may be controlled by a photonic persistent current switch as described herein, implemented on the same chip or on an adjacent chip. Most of the current quantum computing circuits/systems need to be operated at extremely low temperatures (<4 K), and hence, any source of heat dissipation in the circuit can seriously disrupt the functionality of the quantum system under consideration. The heat dissipation issue becomes even more serious for any scalable/integrated quantum system implemented on-chip. The described configuration minimizes or suppresses any heat loss.

The photonic persistent current switch described herein can be operated with very-low-intensity light (ideally in a few photons regime, corresponding to a power of well below 1 microwatt, possibly even about 1 nanowatt or less); consequently, there will be substantially no heat generation. Furthermore, the persistent current switches may be integrated with the on-chip MFG superconducting coils, and the photons for toggling the superconducting states may be guided/delivered to the switching superconducting circuit using on-chip photonic waveguides. These features make the described persistent current switches highly suitable for large scale implementation of on-chip MFG arrays in the state-of-the art quantum integrated systems.

It is noted that in known superconducting optical switches are typically implemented in and used for bulk systems. In such bulk superconducting optical switches, the intensity of light (stream of photons) used for switching can generate heat as well. Therefore, the dimensions of these switches and the heat produced by them make them inapplicable for on-chip implementation. Especially, in any scalable quantum integrated circuits, where a large array of such switches are needed to operate on-site MFGs which in turn tunes individual spin qubits.

As used herein, a superconductor element may be understood to comprise and/or essentially consist of and/or consist of material that can adopt a superconductive state. Superconductive states are known in the art and may be understood to refer to states in which the electrical resistance of a material is zero. The superconductor loop may be understood to entirely consist of superconductor material meaning that the superconductor loop can accommodate a persistent current.

In an embodiment, the illumination system comprises a light source for generating the light. Such light source is for example a laser. The light is for example monochromatic light.

The light may comprise one or more wavelengths in a range from visible light to telecom electromagnetic radiation. The light may comprise one or more wavelengths from a range 532 nm to 1500 nanometer.

In this embodiment, the illumination system may be understood to be configured to direct light onto the piece of superconductor simply in that the light source is aimed at the piece of superconductor. A waveguide (see below) is for example not required in this embodiment.

The light that is directed onto the piece of superconductor material for influencing the electrical resistance of the piece of superconductor may be provided onto the piece in a pulsed manner. To illustrate, the light may be provided in very short pulses, e.g. having a pulse duration of nanoseconds or microseconds. Further, the provided light may have a very low power, for example less than one microwatt or even about one nanowatt or less. In some cases, only a few photons are needed to change the electrical resistance of the piece of superconductor.

In an embodiment, the illumination system comprises a light guiding system, such as a waveguide, to direct the generated light onto the piece of superconductor material. The light guiding system is for example configured to guide light as produced by a laser onto the piece of material.

The light guiding system may comprise the switch as described in {T. Seok, N. Quack, S. Han, R. Muller, and M. Wu, "Large-scale broadband digital silicon photonic switches with vertical adiabatic couplers," Optica 3, 64-70 (2016)}, hereinafter referred to as "Seok at al". The light guiding system may comprise the pair of MEMS actuated vertical adiabatic couplers as described in Seok et al.

The generated light may be directed onto the piece of superconductor material using evanescent coupling.

In an embodiment, the illumination system comprises both the above-described light source as well as the light guiding system.

In an embodiment, the piece of superconductor material and/or the illumination system and/or the light is and/or are configured such that the light impinging on the piece of superconductor material prevents the piece of superconductor material from adopting a superconducting state.

This embodiment enables fast control of the persistent current switch which aids in efficiently initiating a persistent current in the superconductor loop A switch from a non-superconducting state to a superconducting state may namely only require to stop directing the light onto the piece of superconductor material, for example by switching off the light source described above and/or by actuating a light guiding element in order to change the path followed by the illumination light.

Of course, different superconductor materials may require different types of light for influencing the electrical resistance.

In an embodiment, the piece of superconductor material and/or the illumination system and/or the light is and/or are configured such that the light impinging on the piece of superconductor material breaks Cooper pairs that are present in the piece of superconductor material.

In particular, the illumination system may be configured as such in that a light source of the illumination system is configured to generate light that is suitable for breaking Cooper pairs in the piece of superconductor material.

In an embodiment, the persistent current switch comprises a control system for controlling the persistent current switch. In such embodiment, the control system may be configured to perform steps of.

causing the illumination system to direct light onto the piece of superconductor material so that the piece of superconductor material does not adopt a superconducting state, and causing the illumination system to not direct light onto the piece of superconductor material, so that the piece of superconductor material adopts a superconducting state.

Such control system is convenient for initiating a persistent current in the superconductor loop.

The steps of causing the illumination system to direct light onto the piece of superconductor material, respectively, to not direct light onto the piece of superconductor material may be performed by switching on, respectively, off the light source. Additionally or alternatively, the steps of causing illumination system to direct light onto the piece of superconductor material, respectively, to not direct light onto the piece of superconductor material may be performed by controlling the light guiding system to guide light onto the piece of superconductor material, respectively, to not guide light onto the piece of superconductor material. Such control of the light guiding system may be performed by controlling a pair of adiabatic couplers as described in {Seok et al} in order to direct light in a certain direction.

In an embodiment, the persistent current switch is configured to operate at temperatures below 50 Kelvin, preferably below 25 Kelvin, more preferably below 15 Kelvin, most preferably below 10 Kelvin.

This embodiment allows to use superconductor materials having critical temperatures for superconductivity well below 50 Kelvin.

In an embodiment, the superconductor loop and/or the piece of superconductor material comprises niobium, Nb, and/or niobium nitride, NbN, and/or niobium titanium nitride, NbTiN.

In principle, any superconductor material can be used.

One aspect of this disclosure relates to a system comprising a persistent current switch disclosed herein and a cooling system that is configured to cool the persistent current switch, at least the superconductor loop of the persistent current switch, to a temperature at which the superconductor loop can adopt a superconducting state or, in other words, to a temperature which is below the critical temperature of the superconducting material(s) forming the superconductor loop. This temperature is for example below 50 Kelvin and/or below 25 Kelvin and/or below 15 Kelvin and/or below 10 Kelvin. Such system may also comprise a DC power source as described herein.

One aspect of this disclosure relates to a chip having integrated thereon any of the persistent current switches disclosed herein. Preferably, the chip has integrated thereon the superconductor loop. Preferably, the chip has integrated therein, or is at least connected to, a DC power source for emerging the superconductor loop. The chip may have integrated thereon a plurality of the persistent current switches as disclosed herein.

One aspect of this disclosure relates to a quantum computing system comprising a persistent current switch as described herein.

The quantum computing system may comprise the persistent current switch in that it comprises the abovementioned chip that has integrated thereon the persistent current switch.

In such quantum computing system, the persistent current switch is preferably configured to be used for generating a persistent current and associated magnetic field for controlling a qubit of the quantum computing system. The generated magnetic field is for example used to control the so-called operating point of the qubit.

The qubit that is controlled by the magnetic field generated by the persistent current, may be a spin qubit in diamond as described in {F. Jelezko, J. Wrachtrup, "Single defect centres in diamond: A review", Phys. Stat Sol (a) 203, 13, 3207 (2006)}. For routing and detecting photons for the qubits in diamond on-chip, integrated photonics may be used, e.g. as described in {H. Atabaki, et al, "Integrating photonics with silicon nanoelectronics for the next generation of systems on a chip," Nature 556, 349-354 (2018)}.

The persistent current switch could be fabricated directly on the qubit chip, however those can also be fabricated on another chip which is then placed on top of the qubit chip, for example.

A quantum computing system may be understood to be any system that is configured to exploit collective properties of quantum states, such as superposition and entanglement, to perform computation. Such system is typically configured to generate a plurality of qubits, for example thousands of qubits.

The quantum computing system preferably comprises a cooling system that is configured to cool the persistent current switch, at least the superconductor loop of the persistent current switch, to a temperature at which the superconductor loop can adopt a superconducting state or, in other words, to a temperature which is below the critical temperature of the superconducting material(s) forming the superconductor loop. This temperature is for example below 50 Kelvin and/or below 25 Kelvin and/or below 15 Kelvin and/or below 10 Kelvin.

In an embodiment, the quantum computing system comprises a DC power source for energizing the superconductor loop. This DC power source is for example present on the same chip as the persistent current switch.

One aspect of this disclosure relates to a method for initiating a persistent current in a superconductor loop comprising a piece of superconductor material. The method comprises cooling the superconductor loop to below a critical temperature. The method also comprises causing an illumination system to direct light onto the piece of superconductor material so that the piece of superconductor material does not adopt the superconducting state. The illumination system is configured such that the light impinging on the piece of superconductor material substantially does not heat the piece of superconductor material. The method also comprises energizing the superconductor loop comprising causing an electrical current through at least part of the superconductor loop. The method further comprises, while the electrical current is flowing through at least part of the superconductor loop, causing the illumination system to not direct light onto the piece of superconductor material so that the piece of superconductor material adopts a superconductive state so that the superconductor loop becomes superconductive and conducts a persistent current.

The critical temperature may be understood to be the temperature below which the superconductor material forming superconductor loop becomes superconductive.

Preferably, when the light is impinging on the piece of superconductor material to prevent it from adopting a superconductive state, the impinging light is the only factor preventing the piece of superconductor material to adopt the superconductive state. This means that upon the piece of superconductor material no longer receiving this light, it will immediately become superconductive. Thus, preferably, the piece of superconductor material already has a temperature below its critical temperature when the light is impinging on the piece of superconductor material.

In an embodiment of the method, the illumination system comprises a light source for generating the light and the step of causing the illumination system to not direct light onto the piece of superconductor material comprises switching off the light source.

In an embodiment of the method, causing the illumination system to not direct light onto the piece of superconductor material comprises controlling a light guiding system to not direct light onto the piece of superconductor material.

One aspect of this disclosure relates to a data processing system comprising a computer readable storage medium having computer readable program code embodied therewith, and a processor, preferably a microprocessor, coupled to the computer readable storage medium, wherein responsive to executing the computer readable program code, the processor is configured to perform any of the methods described herein.

One aspect of this disclosure relates to a computer program or suite of computer programs comprising at least one software code portion or a computer program product storing at least one software code portion, the software code portion, when run on a computer system, being configured for executing any of the methods described herein.

One aspect of this disclosure relates to a non-transitory computer-readable storage medium storing at least one software code portion, the software code portion, when executed or processed by a computer, is configured to perform any of the methods described herein.

As will be appreciated by one skilled in the art, aspects of the present invention may be embodied as a system, a method or a computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by a processor/microprocessor of a computer. Furthermore, aspects of the present invention may take the form of a computer program product embodied in one or more computer readable medium(s) having computer readable program code embodied, e.g., stored, thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples of a computer readable storage medium may include, but are not limited to, the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of the present invention, a computer readable storage medium may be any tangible medium that can contain, or store, a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber, cable, RF, etc., or any suitable combination of the foregoing. Computer program code for carrying out operations for aspects of the present invention may be written in any combination of one or more programming languages, including an object oriented programming language such as Java™, Smalltalk, C++ or the like and conventional procedural programming languages, such as the "C" programming language or similar programming languages. The program code may execute entirely on the users computer, partly on the users computer, as a stand-alone software package, partly on the users computer and partly on a remote computer, or entirely on the remote computer or server. In the latter scenario, the remote computer may be connected to the users computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems), and computer program products according to embodiments of the present invention. It will be understood that each block of the flowchart illustrations and/or block diagrams, and combinations of blocks in the flowchart illustrations and/or block diagrams, can be implemented by computer program instructions. These computer program instructions may be provided to a processor, in particular a microprocessor or a central processing unit (CPU), of a general purpose computer, special purpose computer, or other programmable data processing apparatus to produce a machine, such that the instructions, which execute via the processor of the computer, other programmable data processing apparatus, or other devices create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

Moreover, a computer program for carrying out the methods described herein, as well as a non-transitory computer readable storage-medium storing the computer program are provided. A computer program may, for example, be downloaded (updated) to the existing systems or be stored upon manufacturing of these systems.

Elements and aspects discussed for or in relation with a particular embodiment may be suitably combined with elements and aspects of other embodiments, unless explicitly stated otherwise. Embodiments of the present invention will be further illustrated with reference to the attached drawings, which schematically will show embodiments according to the invention. It will be understood that the present invention is not in any way restricted to these specific embodiments.

BRIEF DESCRIPTION OF THE DRAWINGS

Aspects of the invention will be explained in greater detail by reference to exemplary embodiments shown in the drawings, in which.

DETAILED DESCRIPTION OF THE DRAWINGS

In the figures, identical reference number indicate identical or similar elements.

Figure 1B:
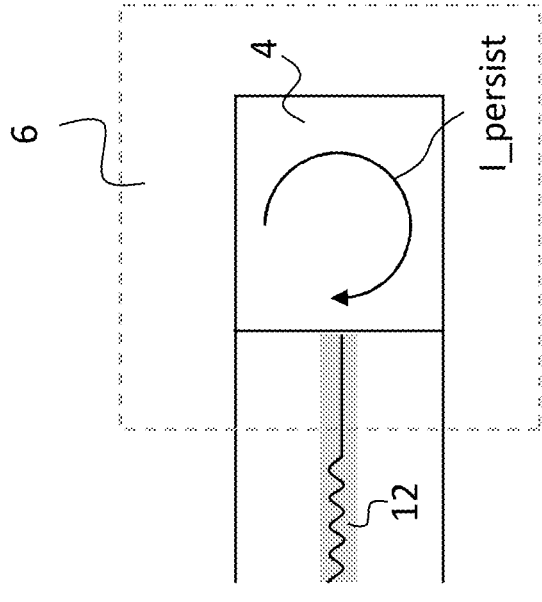
FIGS. 1A and 1B schematically illustrates a persistent current switch and its operation according to an embodiment.
Figure 1A:
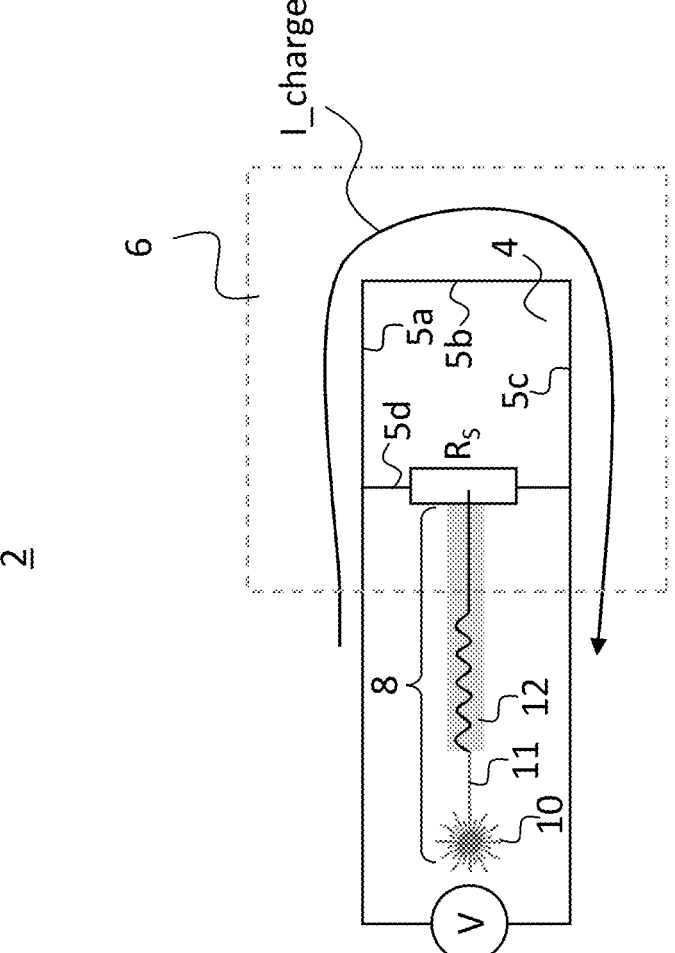

FIGS. 1A and 1B schematically illustrates a persistent current switch 2 and its operation according to an embodiment. FIG. 1A illustrates the persistent current switch in a state which may be referred to as the energizing state and FIG. 1B illustrates the persistent current switch in a state which may be referred to as the persistent state.

In both depicted states, the superconductor loop 4 is at a temperature below a critical temperature, which may be understood to be the temperature below which the superconductor material forming the loop 4 becomes superconductive. To this end, the superconductor loop 4 is typically cooled by means of a cooling system 6, e.g. a cryostat.

When the persistent current switch 2 is being energized (as schematically depicted in FIG. 1A) an electrical current I_charge is caused through at least part of the superconductor loop. In FIG. 1A, this electrical current I_charge flows through superconductor loop segments 5a, 5b, 5c, yet not through superconductor loop segment 5d. Further, in the energizing state, an illumination system 8, which may comprise a light source 10 and which may comprise a light guiding system 12, directs light 11 onto a piece of superconductor material so that the piece of superconductor material does not adopt the superconducting state. In FIG. 1A, the illuminated piece of superconductor material sits in segment 5d of superconductor loop 4. The incident light 11 may be understood to increase the resistance of the piece of superconductor material, as indicated by resistance R_S in FIG. 1, so that the piece of superconductor material does not adopt the superconductive state. As a result, not the entire superconductor loop 4 is in a superconductive state.

The illumination system 8 and the piece of superconductor material may be understood to form a superconductor (SC) photonic switch because upon the piece of superconductor material absorbing photons of the light 11, it can transition from the superconductive state to the normal resistive state.

As described in the microscopic Bardeen-Cooper-Schrieffer (BCS) theory, electrons of a superconductor material condense into Cooper pairs at low temperature. The formation of Cooper pairs requires an attraction potential to overcome the Coulomb repulsion between electrons. In the SC material, this attraction potential arises from the lattice mediated electron-electron interaction below a sufficiently low temperature, known as the critical temperature.

When the SC material is at temperatures below the critical temperature, the vibrational energy of the material lattice is not enough to disrupt the Cooper pairs. Thus, to break these Cooper pairs at low temperature, sufficient energy must be supplied externally to the SC material for overcoming the energy gap and bringing the collective ensemble into an excited state.

Photons which have higher energy than the superconducting gap of the SC material can be used as an external stimulus for breaking the Cooper pairs, leading to a transition between superconductive state to normal resistive state.

Superconductor devices are fast and ultra-sensitive to optical excitation because of their quantum nature and low-noise, cryogenic operation environment. The energy gap of SC materials is typically two to three orders of magnitude smaller compared to the energy gaps in semiconductors. Thus, a superconductor device can efficiently absorb and/or respond to photons with much lower energy.

If the superconductor material forming the superconductor loop 4 is for example NbTiN (SC energy gap ~5 meV), then any light from UV to mid-infrared range could be efficiently used to prevent the piece of superconductor material from adopting the superconductive state. However, visible light may also be used, e.g. green light having a wavelength of approximately 532 nm, ~2.33 eV), as this light is associated with an energy much higher than the SC energy gap for NbTiN. Such green light may also be used to excite diamond defect centres (spin qubits). In such case, green light would be integrated or coupled to the system anyway.

Regarding the optical power needed to prevent the piece of superconductor to adopt the superconductive state, depending on the device geometry a switching between superconductive state and normal resistive state can be efficiently triggered with even a single photon. In an embodiment, the light has an optical power in the sub-microwatt range, which should be sufficient to prevent the piece of superconductor material to adopt a superconductive state.

In principle, the superconductor loop 4 and the piece of superconductor material in this loop can comprise, e.g. consist of, any superconductor material and a large spectrum of wavelengths can be used for the illumination light to control whether or not the piece of superconductor material adopts the superconductive state, as long as the energy gap of the piece of superconductor material is lower than the photon energy of the light that is used.

In an embodiment, the piece of superconductor material is a type-II superconductor material. In such embodiment, the rest of the superconductor loop may of course also consist of this same type-II superconductor material. As known, type-II SC materials have two temperature-dependent critical magnetic fields. Between the two critical values, the magnetic field can partially penetrate the SC material by forming isolated points called vortices. These vortices aid the photon mediated state transition of the SC material, and hence type-II SC materials can be suitably used as superconductor material for the piece of superconductor material that is going to be illuminated by the light and for the superconductor loop.

As already indicated above, the piece of superconductor material and/or the superconductor loop may comprises and/or consist of NbTiN. It has been found that the Ti atoms in the NbTiN compound act as a nitrogen getter and improve the quality of crystals, e.g. as compared to NbN, by preventing the formation of vacancies. In addition, NbTiN growth process is relatively undemanding in terms of thermal budget, e.g. compared to the case of NbN. To illustrate, for NbN, the formation of the SC structure of the B1 stoichiometry takes place efficiently for temperatures above 1350 C. Such high temperatures in an intermediate process step can be incompatible with other steps/materials and not desired in an integrated system. NbTiN, on the other hand, can be deposited on substrates at room temperature and even with a large lattice mismatch from the growth, it can maintain good superconducting properties. RF loss, kinetic inductance etc. are also relatively low for NbTiN thin film devices.

Also, (polycrystalline) NbTiN has a relatively high critical temperature (approximately 10 K), e.g. as compared to amorphous superconductor materials. Thus, NbTiN based persistent current switches can be operated at 2.5 K in simple, cheap, and reliable cryostats rather than requiring dilution refrigerators for sub-kelvin temperatures. Also, NbTiN has sufficiently high critical current densities which enables suitable operating currents for the persistent current switches disclosed herein.

At some point in time, while the electrical current I_charge is flowing through at least part of the superconductor loop 4, the illumination system 8 is caused to not direct light onto the piece of superconductor material so that the piece of superconductor material adopts a superconductive state so that the superconductor loop 4 becomes superconductive. This results in a persistent current I_persist through the loop 4 as depicted in FIG. 1B. Note that in the persistent state, no voltage needs to be applied to the loop.

It should be appreciated that the illumination system 8 is configured such that the light 11 impinging on the piece of superconductor material substantially does not heat the piece of superconductor material. When the piece of superconductor material is biased closed to the critical current and absorbs photons of the light 11, the creation, multiplication, and diffusion of quasiparticles and phonons take place. The quasiparticle cloud causes a local reduction of the superconducting order parameter, re-distribution of the current density, and lowering of the effective critical current density. This instability of the superconducting state leads to the formation of a local non-superconducting state in the piece of superconductor material.

Once a resistive region is formed in the piece of superconductor material, it experiences internal Joule heating. This causes the resistive region to grow and the resistance can increase to a value on the order of several kilo-ohms. Now, the superconductor loop 4 is preferably designed in such a way that, apart from piece of superconductor material, the rest of the loop remains in the SC state and acts as a parallel current path. Thus, as soon as the joule heating and the local resistance in the illuminated piece of superconductor material starts to grow, the bias current starts to get diverted to a greater extent into the other section of the loop. This effect also reduces the heat generation in the piece of superconductor material. In fact, this heat generation may be considered negligible. The light 11 incident on the piece of superconductor material may be embodied as light pulses Such light pulses are preferably very short (nano/microseconds) and preferably have low power (sub-microwatt), so that any heat contribution (phonon generation) from the light pulses are also negligible. Once the light 11 is no longer directed at the piece of superconductor material, the superconductive state is restored. This causes the entire superconductor loop 4 to be superconductive again and a persistent current starts I_persist to flow in the loop 4.

PECVD grown silicon nitride (SiN) may be used for making the waveguides. PECVD SiNs have a refractive index around 1.9-2 and negligible extinction coefficient at 532 nm. Hence, SiN is transparent in the visible range of light, PECVD SiN has a waveguide loss of ~0.1-2 dB/cm at 532 nm, CMOS process compatible and a prominent workhorse of the state-of-the-art photonic integrated circuits (PICs). Highly efficient PIC components including waveguides, couplers, splitters as well as photonic/optomechanic crystals and cavities have been demonstrated in the visible range with SiN. So, implementing SiN waveguides to route the excitation light is relatively straight forward. A SiN waveguide of width ~800 nm and thickness of ~200 nm may be used, which efficiently confines and guides light of wavelengths <650 nm. For coupling the waveguide to the piece of superconductor material, we deposit and pattern the SC material on top of or buried inside the waveguide, similar to the design and implementation of waveguide integrated superconducting nanowire single-photon detectors (SNSPDs).

Figure 2B:
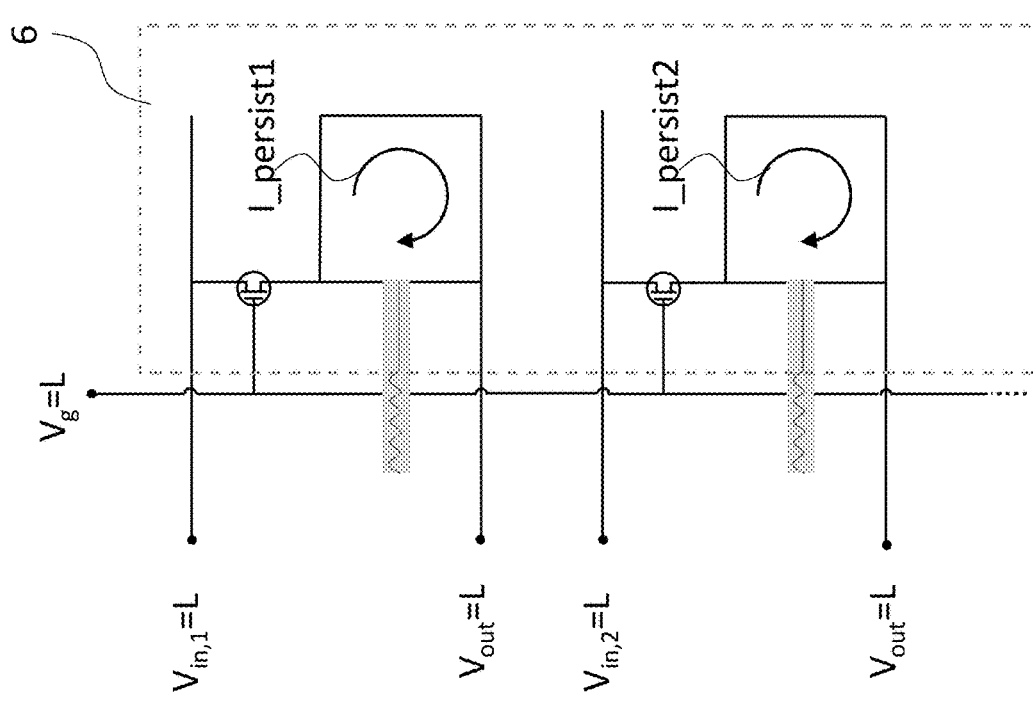
FIGS. 2A and 2B illustrate a system according to an embodiment comprising a plurality of persistent current switches.
Figure 2A:
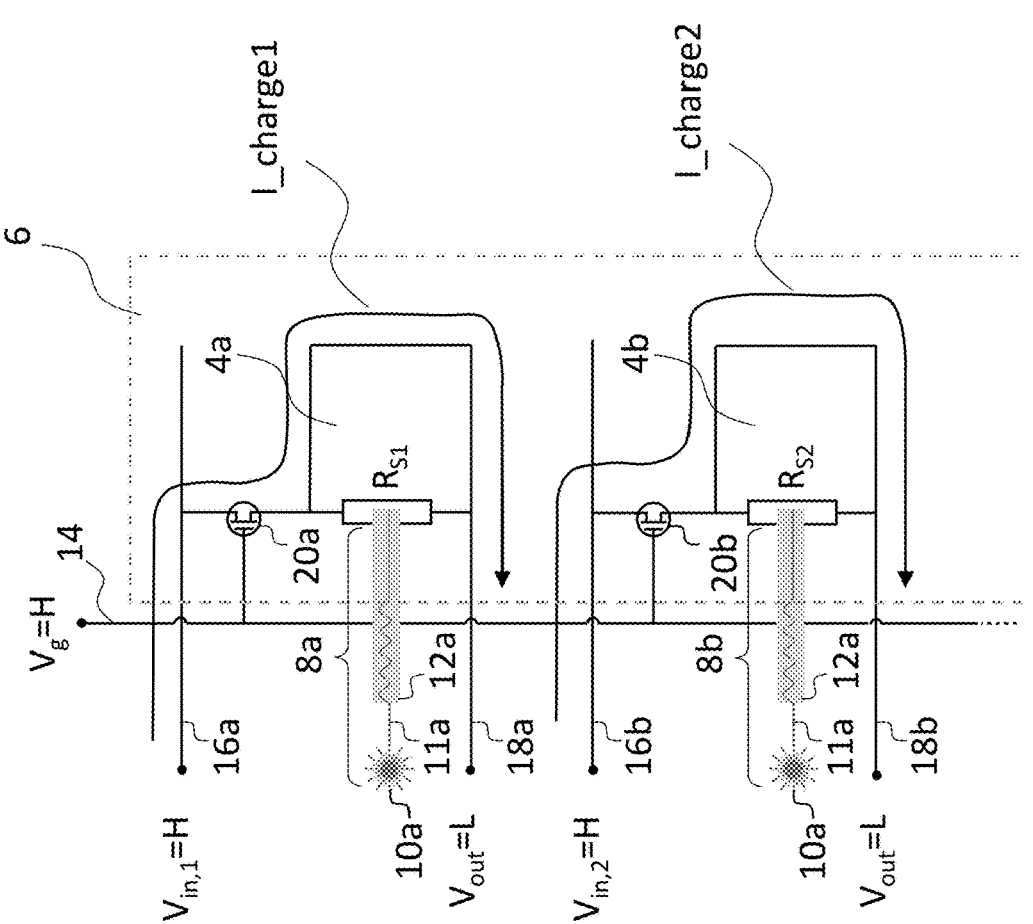

FIGS. 2A and 2B schematically illustrates system, e.g. a chip, comprising a plurality of persistent current switches as described herein (two are shown). Again, FIG. 2A illustrates the energizing state and FIG. 2B the persistent state. By suitably applying a voltage on line 14 and 16A, 16B, 16C and 16D, and by separately controlling illumination systems 8a and 8b, each superconductor loop may be energized separately.

Figure 3A:
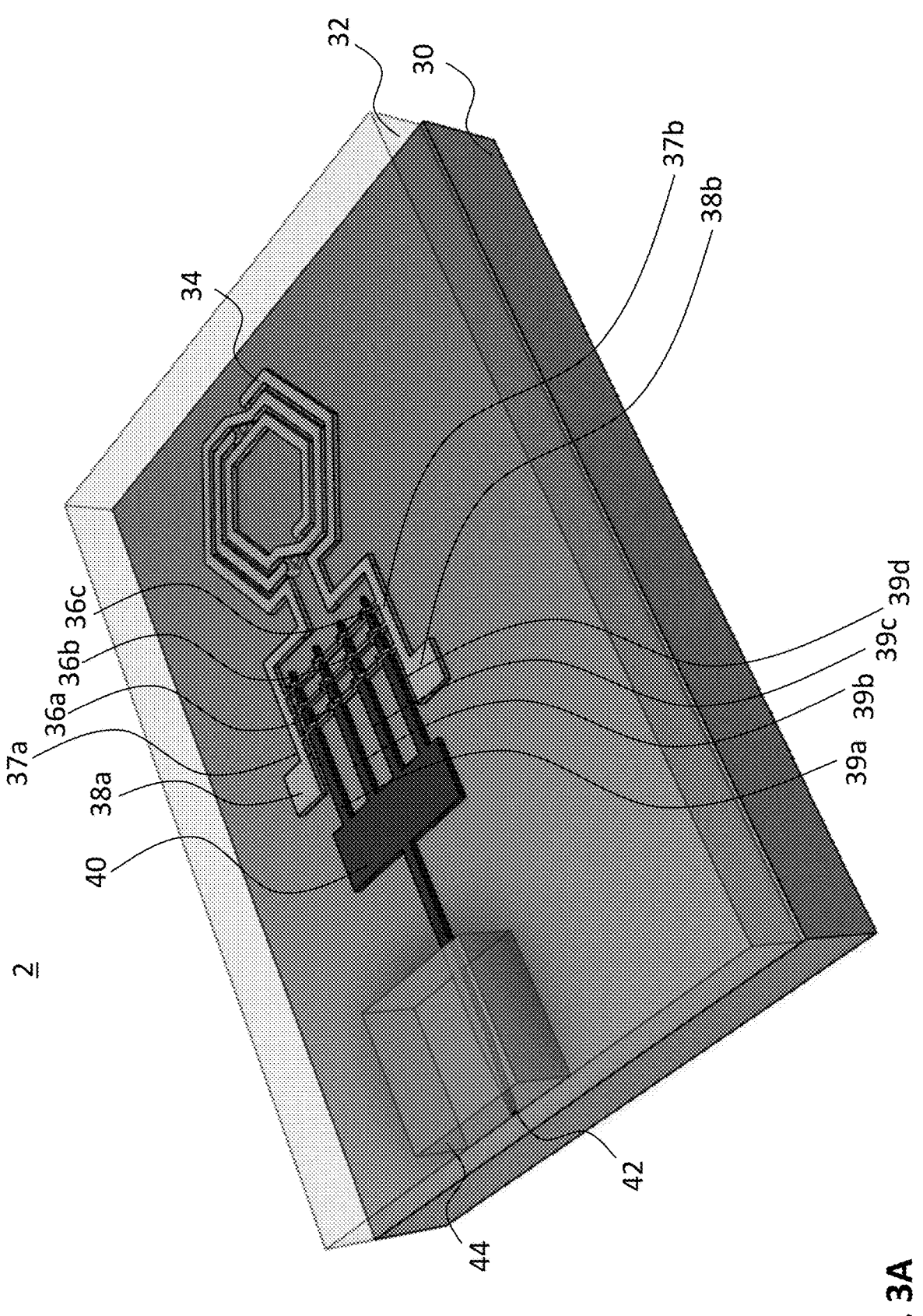
FIG. 3A presents a three-dimensional view of a persistent current switch according to an embodiment.
Figure 3B:
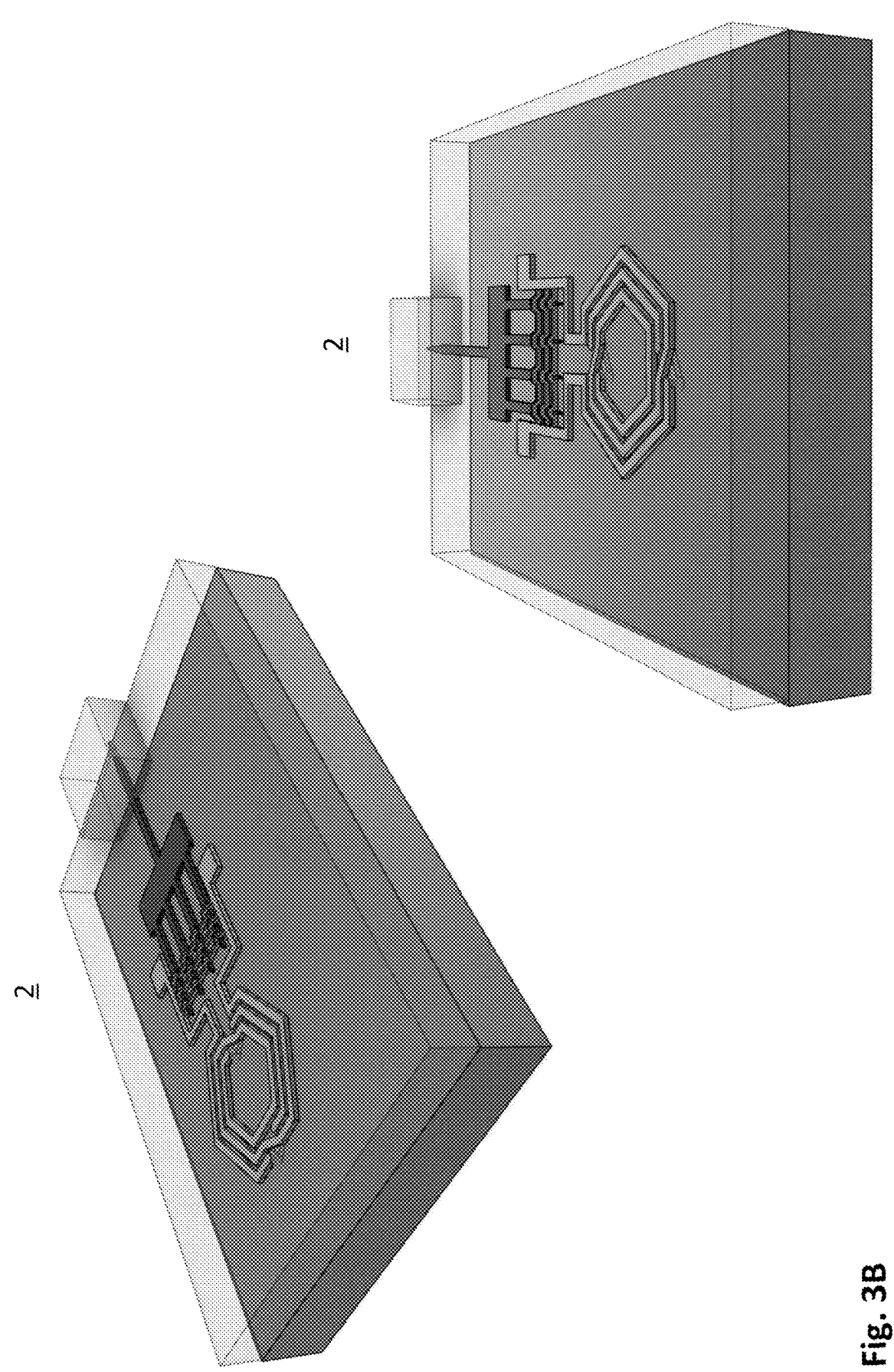
FIG. 3B presents two more three-dimensional views of the persistent current switch shown in FIG. 3A.

FIG. 3A presents a three-dimensional view of a persistent current switch according to an embodiment. FIG. 3B presents two more three-dimensional views of the same persistent current switch 2.

The persistent current switch may be fabricated as follows. First, a silicon-on-insulator (SOI) wafer may be provided. The Si device layer 30 may then be oxidized so that a buried oxide layer (BOX) layer 32 is formed. Additionally or alternatively, the Si device layer 20 is removed selectively from locations where the superconductor loop and illumination system will be fabricated in order to expose an oxide layer that sits beneath the Si layer. This is convenient if the illumination system and superconductor loop are designed to be made on an oxide layer, e.g. an SiO2 layer. The illumination system and superconductor loop can then be fabricated on the BOX layer 32 and/or be fabricated on the exposed oxide layer beneath Si layer 30. As an example, SiN waveguides and a NbTiN superconductor loop can be suitably made on an oxide layer, e.g. on a SiO2 layer. The Si layer is convenient to have in the chip because it can be used at other locations at the chip for other circuitry, e.g. for complex photonic circuitry. However, for the purposes of the switch disclosed herein, the Si layer 30 is not per se required.

In the embodiment of FIG. 3A, the superconductor loop consists of a superconductor inductor 34, also referred to a magnetic field generator (MFG) 34, a first "arm" 37 a connected to the inductor loop 34, a second arm 37b connected to the inductor loop 34, and three pieces of superconductor material 36a, 36b, 36c which connect the first arm 37a to the second arm 37b.

Then, an approximately 200 nm thick, low stress silicon nitride layer may be deposited on the selectively exposed BOX (buried oxide) layer 32 using the plasma enhanced chemical vapor deposition (PECVD) technique. The deposition process may be carried out at 300 degrees Celsius using a N2/SiH4/NH3 gas mixture in a PECVD reactor. A post deposition anneal may then be performed at 600 degrees Celsius in order to reduce the residual stress of the deposited film. The inverse tapered photonic waveguides 42 and multimode interference (MMI) coupler sections 40 may be patterned with electron beam lithography (RIE) and subsequent reactive ion etching (RIE) of SiN layer in fluorocarbon plasmas.

The superconductor loop may be fabricated with a combination of direct-write (laser writer) photolithography, SC (NbTiN) layer sputtering and SC lift-off process steps. SC circuit patterns and alignment markers can be transferred to a positive tone photoresist (S1805) with a maskless, direct-write lithography technique using a laserwriter. Then an approximately 200 nm thick, low stress SC (NbTiN) layer may be deposited in a high vacuum chamber onto the patterned photoresist from a 3 inch 99.99% pure NbTi target in an Ar/N2 atmosphere, using a magnetron sputter system. After the NbTiN deposition, a lift-off step may be carried out. In this step, the photoresist and SC materials can be washed away with hot acetone from the non-patterned area leaving behind NbTiN thin films only in the patterned area. Through these steps each layer of SC circuitry is implemented. For multiple layer SC circuit pattern, these process steps are repeated as required. Accurate overlay of multiple layers can be achieved through utilizing alignment markers from the previous patterning processes.

The SC (NbTiN) strip-lines 36a, 36b, 36c may be deposited on the inverse tapered SiN waveguides 39a, 39b, 39c, 39d. Through the inverse tapered sections, photon streams can be evanescently coupled to the NbTiN strip-lines 36a, 36b, 36c which means that the photons impinge on the NbTiN stip-lines. The absorption of photons from for example a switching laser pulse leads to a transition from superconducting state to normal resistive state in the NbTiN strip-lines 36a. 36b. 36c. In the absence of the laser pulse and at sufficiently low temperature, NbTiN strip-lines 36a, 36b, 36c will be in a superconducting state and form a superconducting loop to allow a persistent current to circulate through the superconductor loop and thus through the arms 37a and 37b, through the pieces of superconductor material 36a, 36b, 36c and through the magnetic field generator 34.

Finally, a dielectric structure 44 may be patterned and deposited on an inverse tapered, SiN waveguide 42 at the end facet of the chip in order to allow edge coupling of light into the chip (for example from an optical fiber to the waveguide). The edge coupler structure 44 fabricated on the inverse tapered waveguide 42 reduces the mode mismatch between the optical fiber (not shown) and the waveguide and efficiently couples the switching laser pulses into the chip. The inverse tapered waveguide 42, the MMI 40 and the SC (NbTiN) strip-lines 36a, 36b, 36c may be understood to form the illumination system referred to in this disclosure that is configured to direct light onto a piece of superconductor material, that is part of a superconductor loop, for influencing an electrical resistance of the piece of superconductor material.

FIG. 3B shows the same persistent current switch from two different angles.

Figure 4:
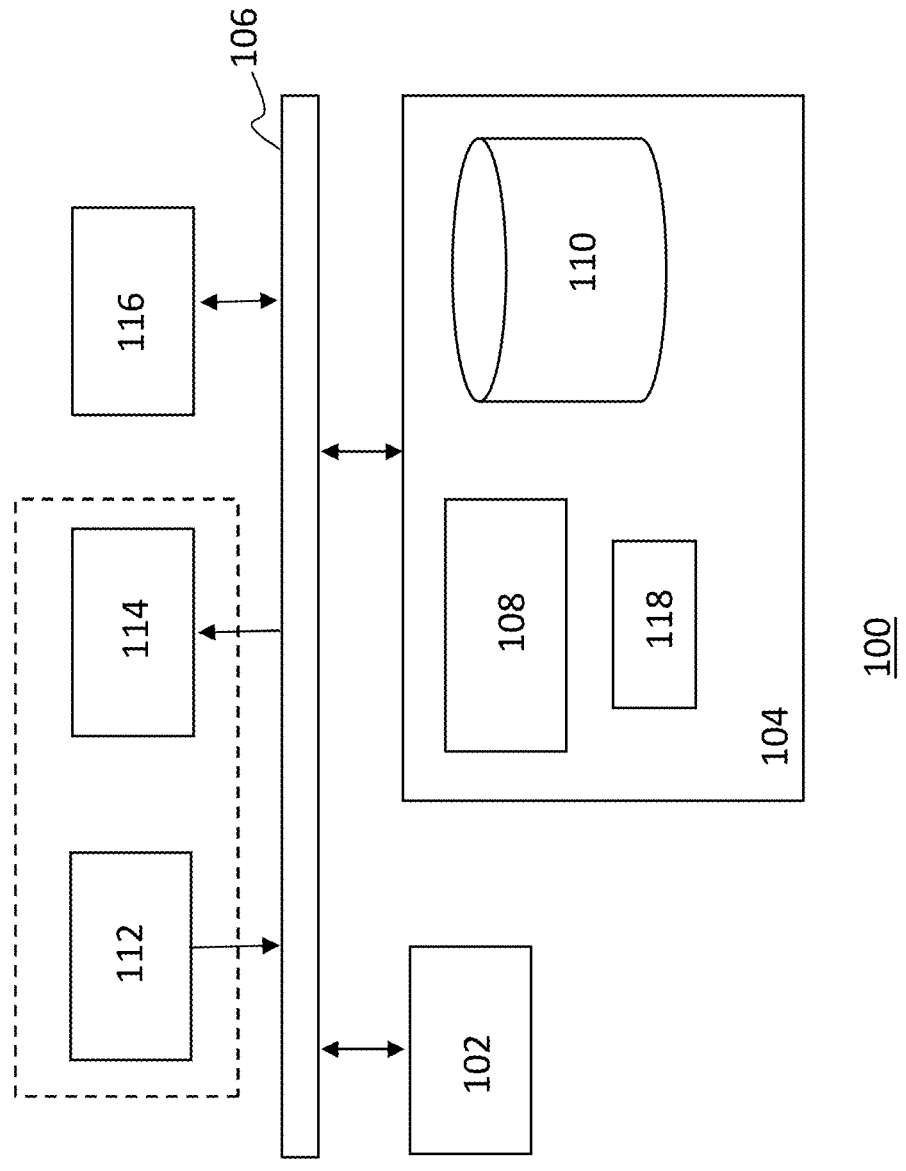
FIG. 4 illustrates a data processing system according to an embodiment.

FIG. 4 depicts a block diagram illustrating a data processing system according to an embodiment.

As shown in FIG. 4, the data processing system 100 may include at least one processor 102 coupled to memory elements 104 through a system bus 106. As such, the data processing system may store program code within memory elements 104. Further, the processor 102 may execute the program code accessed from the memory elements 104 via a system bus 106. In one aspect, the data processing system may be implemented as a computer that is suitable for storing and/or executing program code. It should be appreciated, however, that the data processing system 100 may be implemented in the form of any system including a processor and a memory that is capable of performing the functions described within this specification.

The memory elements 104 may include one or more physical memory devices such as, for example, local memory 108 and one or more bulk storage devices 110. The local memory may refer to random access memory or other non-persistent memory device(s) generally used during actual execution of the program code. A bulk storage device may be implemented as a hard drive or other persistent data storage device. The processing system 100 may also include one or more cache memories (not shown) that provide temporary storage of at least some program code in order to reduce the number of times program code must be retrieved from the bulk storage device 110 during execution.

Input/output (1/O) devices depicted as an input device 112 and an output device 114 optionally can be coupled to the data processing system. Examples of input devices may include, but are not limited to, a keyboard, a pointing device such as a mouse, a touch-sensitive display, or the like. Examples of output devices may include, but are not limited to, a monitor or a display, speakers, the light source referred to herein, the illumination system referred to herein, the light guiding system referred to herein, the cooling system referred to herein, the power source for providing electrical power for energizing the superconductor loop referred to herein, or the like. Input and/or output devices may be coupled to the data processing system either directly or through intervening/O controllers.

In an embodiment, the input and the output devices may be implemented as a combined input/output device (illustrated in FIG. 4 with a dashed line surrounding the input device 112 and the output device 114). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 116 may also be coupled to the data processing system to enable it to become coupled to other systems, computer systems, remote network devices, and/or remote storage devices through intervening private or public networks. The network adapter may comprise a data receiver for receiving data that is transmitted by the systems, devices and/or networks to the data processing system 100, and a data transmitter for transmitting data from the data processing system 100 to the systems, devices and/or networks. Modems, cable modems, and Ethernet cards are examples of different types of network adapter that may be used with the data processing system 100.

As pictured in FIG. 4, the memory elements 104 may store an application 118. In various embodiments, the application 118 may be stored in the local memory 108, the one or more bulk storage devices 110, or apart from the local memory and the bulk storage devices. It should be appreciated that the data processing system 100 may further execute an operating system (not shown in FIG. 4) that can facilitate execution of the application 118. The application 118, being implemented in the form of executable program code, can be executed by the data processing system 100, e.g., by the processor 102. Responsive to executing the application, the data processing system 100 may be configured to perform one or more operations or method steps described herein.

In one aspect of the present invention, the data processing system 100 may represent a control system that is configured to control any of the systems and/or subsystems described herein to perform their respective functions. To illustrate, such control system may be configured to control the light source referred to herein, the illumination system referred to herein, the light guiding system referred to herein, the cooling system referred to herein and/or a power source for providing electrical power for energizing the superconductor loop as described herein, by sending appropriate control signals to these systems and/or subsystems.

Various embodiments of the invention may be implemented as a program product for use with a computer system, where the program(s) of the program product define functions of the embodiments (including the methods described herein). In one embodiment, the program(s) can be contained on a variety of non-transitory computer-readable storage media, where, as used herein, the expression "non-transitory computer readable storage media" comprises all computer-readable media, with the sole exception being a transitory, propagating signal. In another embodiment, the program(s) can be contained on a variety of transitory computer-readable storage media Illustrative computer-readable storage media include, but are not limited to: (i) non-writable storage media (e.g., read-only memory devices within a computer such as CD-ROM disks readable by a CD-ROM drive, ROM chips or any type of solid-state non-volatile semiconductor memory) on which information is permanently stored; and (ii) writable storage media (e.g., flash memory, floppy disks within a diskette drive or hard-disk drive or any type of solid-state random-access semiconductor memory) on which alterable information is stored. The computer program may be run on the processor 102 described herein.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments of the present invention has been presented for purposes of illustration, but is not intended to be exhaustive or limited to the implementations in the form disclosed. Many modifications and variations will be apparent to those of ordinary skill in the art without departing from the scope and spirit of the present invention. The embodiments were chosen and described in order to best explain the principles and some practical applications of the present invention, and to enable others of ordinary skill in the art to understand the present invention for various embodiments with various modifications as are suited to the particular use contemplated.

The invention claimed is:

1. A persistent current switch for controlling a persistent current in a superconductor loop, the persistent current switch comprising:
   a piece of superconductor material that is part of the superconductor loop, and
   an illumination system that is configured to direct, using a light-guiding system, light onto the piece of superconductor material for influencing an electrical resistance of the piece of superconductor material,
   wherein the illumination system is configured such that the light impinging on the piece of superconductor material substantially does not heat the piece of superconductor material, and
   wherein the light impinging on the piece of superconductor material has a power of less than 1 μW.

2. The persistent current switch according to claim 1, wherein the illumination system comprises a light source for generating the light.

3. The persistent current switch according to claim 1, wherein the light-guiding system is an on-chip photonic waveguide.

4. The persistent current switch according to claim 1, wherein the piece of superconductor material and/or the illumination system and/or the light is and/or are configured such that the light impinging on the piece of superconductor material prevents the piece of superconductor material from adopting a superconducting state.

5. The persistent current switch according to claim 4, wherein the piece of superconductor material and/or the illumination system and/or the light is and/or are configured such that the light impinging on the piece of superconductor material breaks Cooper pairs that are present in the piece of superconductor material.

6. The persistent current switch according to claim 1, further comprising
   a control system for controlling the persistent current switch, the control system being configured to perform steps of:
   causing the illumination system to direct light onto the piece of superconductor material so that the piece of superconductor material does not adopt a superconducting state, and
   causing the illumination system to not direct light onto the piece of superconductor material, so that the piece of superconductor material adopts the superconducting state.

7. The persistent current switch according to claim 1, wherein the persistent current switch is configured to operate at temperatures below 50 Kelvin.

8. The persistent current switch according to claim 1, wherein the superconductor loop and/or the piece of superconductor material comprises niobium, Nb, and/or niobium nitride, NbN, and/or niobium titanium nitride, NbTiN.

9. A quantum computing system comprising the persistent current switch according to claim 1.

10. The quantum computing system according to claim 9, further comprising a DC power source for energizing the superconductor loop.

11. The persistent current switch according to claim 2, wherein the light source is a laser.

12. The persistent current switch according to claim 7, wherein the persistent current switch is configured to operate at temperatures below 10 Kelvin.

13. A chip having integrated thereon a persistent current switch for controlling a persistent current in a superconductor loop, the persistent current switch comprising:

a piece of superconductor material that is part of the superconductor loop, and an illumination system that is configured to direct, using a light-guiding system, light onto the piece of superconductor material for influencing an electrical resistance of the piece of superconductor material, wherein the illumination system is configured such that the light impinging on the piece of superconductor material substantially does not heat the piece of superconductor material, and wherein the light impinging on the piece of superconductor material has a power of less than 1 μW.

14. The chip according to claim 13, wherein the persistent current switch is configured to operate at temperatures below 50 Kelvin.

15. The chip according to claim 13, wherein the illumination system comprises a light source for generating the light and wherein the light-guiding system is an on-chip photonic waveguide.

16. A method for initiating a persistent current in a superconductor loop comprising a piece of superconductor material, the method comprising cooling the superconductor loop to below a critical temperature, and causing an illumination system to direct light onto the piece of superconductor material so that the piece of superconductor material does not adopt a superconducting state, wherein the illumination system is configured such that the light impinging on the piece of superconductor material substantially does not heat the piece of superconductor material and wherein the light impinging on the piece of superconductor material has a power of less than 1 μW, and energizing the superconductor loop comprising causing an electrical current through at least part of the superconductor loop, and while the electrical current is flowing through at least part of the superconductor loop, causing the illumination system to not direct light onto the piece of superconductor material so that the piece of superconductor material adopts the superconductive state so that the superconductor loop becomes superconductive and conducts the persistent current.

17. The method according to claim 16, wherein the illumination system comprises a light source for generating the light and wherein the step of causing the illumination system to not direct light onto the piece of superconductor material comprises switching off the light source.

18. The method according to claim 16, wherein causing the illumination system to not direct light onto the piece of superconductor material comprises controlling a light guiding system to not direct light onto the piece of superconductor material.

* * * * *